United States Patent [19]
Shigyo

[11] Patent Number: 6,115,930
[45] Date of Patent: Sep. 12, 2000

[54] METHOD AND LAMINATED MEMBER FOR MEASURING GAP DIMENSION

[75] Inventor: Masao Shigyo, Tokyo, Japan

[73] Assignee: Fuji Photo Film Co., Ltd., Kanagawa, Japan

[21] Appl. No.: 09/482,636

[22] Filed: Jan. 14, 2000

Related U.S. Application Data

[62] Division of application No. 09/095,423, Jun. 11, 1998.

[51] Int. Cl.[7] .............................. G01B 3/00; G01B 5/004; G01B 5/01
[52] U.S. Cl. .................................. 33/542; 33/543
[58] Field of Search .............................. 33/494, 531, 542, 33/544.4, 567, 613, 783; 73/762, 159, 160; 116/212

[56] References Cited

U.S. PATENT DOCUMENTS

| | | | |
|---|---|---|---|
| 2,114,936 | 4/1938 | Pilnick | 33/342 |
| 2,846,772 | 8/1958 | Strausser | 33/342 |
| 4,015,465 | 4/1977 | Scott | 116/212 |
| 4,112,355 | 9/1978 | Gibson, Jr. et al. | 324/57 R |
| 5,174,030 | 12/1992 | Clot et al. | 33/783 |
| 5,285,684 | 2/1994 | Uesugi et al. | 73/159 |
| 5,698,796 | 12/1997 | Hirano | 73/160 |
| 5,768,794 | 6/1998 | Kelly | 33/544.4 |

*Primary Examiner*—Diego Gutierrez
*Assistant Examiner*—Faye Francis
*Attorney, Agent, or Firm*—Sughrue, Mion, Zinn, Macpeak & Seas, PLLC

[57] ABSTRACT

A method and a laminated member for measuring the dimension of a gap for passing a card therethrough are provided. A pressure measuring film is superposed on an elastic mat that gradually becomes thinner in the card-inserting direction, and passed through the gap so as to determine the dimension of the gap from the position where the pressure measuring film has started to develop a color. As the elastic mat, one that has a thickness changing in steps may be used. An alternative embodiment uses a pressure measuring board in place of the pressure measuring film, the pressure measuring board having plural pressure sensors for electrically detecting pressures applied in the direction of width. The data on the pressures detected by the pressure sensors is temporarily stored in a memory provided on the pressure measuring board, and after the passage through the gap, the contents of the memory are transferred to an external host computer via a wiring cable or in a contactless fashion via an antenna, and the pressure distribution is analyzed by the external host computer.

15 Claims, 14 Drawing Sheets

METHOD AND LAMINATED MEMBER FOR MEASURING GAP DIMENSION

This is a divisional of Application Ser. No. 09/095,423 filed Jun. 11, 1998, the disclosure of which is incorporated herein by reference.

BACKGROUND OF THE INVENTION

1. Field of the Invention

The present invention relates to a method for measuring the dimension or clearance of a gap of a carrying path including a magnetic head through which a card is passed when a passenger sets the card on an automatic ticket checking and collecting machine at a train station or in an one-man control bus, or on other similar machine. The present invention covers a reading unit of credit cards and prepaid cards. Further, the invention also relates to a gap clearance measuring laminated member and a gap clearance measuring system directly used for implementing the foregoing method.

2. Description of Related Art

An automatic ticket examining (or checking and collecting) machine at a train station or in a bus, a telephone adapted for telephone cards, or a reading device of credit cards or prepaid cards reads the information stored in a magnetic card or writes new data to the card by passing it between a carrying roller and a magnetic head. It is necessary to properly control the contact pressure of the magnetic head with respect to the card so as to enable the magnetic head to perform accurate reading and writing.

For cards other than magnetic cards, it is required to control the gap relative to a reading head to a proper dimension i.e. gap clearance. For this purpose, it is necessary to precisely adjust the gap formed between the magnetic head or the reading head and the carrying roller facing against the magnetic head or the reading head in accordance with the predetermined thickness of a card which passes therethrough. In order to adjust the gap clearance, conventionally, the machine has been disassembled and a thickness gauge has been applied or the card has been repeatedly passed through the gap until the gap is properly adjusted.

The aforesaid conventional method in which the card is repeatedly passed through the gap to achieve proper adjustment of the gap has been posing a problem in that it takes much effort and time.

Especially in the case of the automatic ticket examining machines with an extremely high operation frequency, maintenance staff must check them every morning, and the problem described above has been serious because of the need of much time and effort, that is, low efficiency. In addition, there has been another problem in that the gap adjustment depends on the experiences and intuition of each maintenance person, so that the adjusted gap tends to be nonuniform or inaccurate.

SUMMARY OF THE INVENTION

The present invention has been made with a view toward solving the problems described above, and it is a first object thereof to provide a method for measuring a gap dimension which method permits easy, accurate measurement of the gap through which cards are passed and also permits the adjustment of the gap to be performed objectively and accurately without depending on the experiences or intuition of the maintenance staff. It is a second object of the present invention to provide a laminated member for measuring a gap dimension, the laminated member being used directly for implementing the foregoing method. Further, it is a third object of the present invention to provide a system for measuring a gap dimension, the system being used directly for implementing the foregoing method.

The first object of the present invention is attained by a provision of a method for measuring the dimension of a gap for passing a card therethrough, comprising the steps of:

(a) providing a laminated member comprising a pressure measuring film superposed on an elastic mat, the pressure measuring film causing a pressurized portion thereof to develop a color, the elastic mat being formed such that the thickness thereof gradually increases from a front end of the mat to a rear end of the mat along the direction in which the card is inserted into the gap;

(b) passing said laminated member through said gap; and (c) inspecting the position where the pressure measuring film starts to develop the color to determine the dimension of said gap.

The elastic mat employed for the method may be, for example, the one having its thickness varying in steps. Preferably, the elastic mat is provided with a plurality of projecting sections or rows, which are parallel to the card inserting direction and which are arranged in stripes, at least on one surface thereof so that it may be easily compressed and deformed. The top surfaces of the projecting sections should be formed in steps.

Alternatively, the elastic mat may be formed so that it has a uniform thickness and the pressure required for causing a predetermined compression and deformation gradually decreased in the direction in which cards are inserted. As another alternative, a plurality of laminated members comprised of pressure measuring films superposed on a plurality of elastic mats which are uniform in thickness but different from each other in thickness are prepared, then the laminated members are passed through the gap in order, starting with a thinnest one, for example, so as to find the dimension of the gap from the thickness of the one that starts to develop a color.

The second object of the present invention is attained by a provision of a laminated member for measuring the dimension of a gap for passing a card therethrough, comprising:

an elastic mat having the top surface provided with a stepped portion that gradually grows taller in steps from a front end thereof to a rear end thereof; and a pressure measuring film superposed on said elastic mat and causing a pressurized portion thereof to develop a color.

Preferably, at least one surface of the elastic mat is provided with a plurality of projecting rows which are parallel to the direction in which cards are inserted, and steps are formed on the top surfaces of the projecting rows.

The first object of the present invention is also attained by a provision of a method for measuring the dimension of a gap for passing a card therethrough, comprising the steps of:

(a) providing a laminated member comprising a pressure measuring board and an elastic mat, the pressure measuring board having plural pressure sensors arranged substantially in the direction in which the card is inserted into the gap to electrically detect the pressure applied in the direction of the thickness of the respective pressure sensors, the elastic mat being superposed to cover at least said pressure sensors, the thickness of the elastic mat increasing from a front end of the mat to a rear end of the mat along the direction in which the card is inserted into the gap;

(b) passing said laminated member through said gap;

(c) storing the pressures detected by said plural pressure sensors; and (d) after the passage of said card through said gap, reading the stored pressures from the laminated member to determine the dimension of said gap.

The elastic mat used for this purpose may be formed so that the thickness thereof changes in steps toward the leading edge thereof or it may alternatively be formed to have a surface inclining continuously. The data on the pressures detected by the respective pressure sensors when the laminated member is passed through the gap is temporarily stored in the memory provided on the pressure measuring board, and the contents of the memory are transferred via a wiring cable to an external host computer after the passage through the gap, then the pressure distribution can be analyzed by the external host computer. The data on the pressures detected when the laminated member passes through the gap can be read by a reader provided in the carrying path by wireless via an antenna, and it can be further transferred to the external host computer from the reader.

The second object of the present invention can be attained also by a laminated member for measuring the dimension of a gap for passing a card therethrough, comprising:

an elastic mat having a stepped portion which gradually grows higher in steps from the front end thereof to the rear end thereof; and a pressure measuring board placed on said elastic mat and having plural pressure sensors arranged along said stepped portion.

The elastic mat may be provided with a continuous slope instead of the stepped portion. The pressure sensors may be load cells employing strain gauges or carrier diffusion type semiconductor pressure sensors. Two sheets, in which many parallel thin-wire electrodes formed on one surface of each of insulating sheets are covered with a thin film of pressure-sensitive resistive ink, are prepared and placed together face to face in such a manner that the electrodes are opposed to each other so that the electrodes of each sheet intersect at substantially right angles in order to provide the intersections of the electrodes as the pressure sensors. In this case, many pressure sensors can be arranged in a matrix pattern to permit two-dimensional pressure distribution.

The pressure measuring board has a microcomputer, a semiconductor memory, and an external connection terminal to store the pressure data in the semiconductor memory when the laminated member passes through the gap and to make connection to the external host computer via the external connection terminal so as to transfer the data to the external host computer after the laminated member passes through the gap. The data may be transferred by wireless. For instance, the laminated member may be equipped with a single-chip computer and an antenna to transfer data to and from the antenna of the reader provided in the card carrying path. In this case, the single-chip computer incorporates a processor for processing the outputs of the pressure sensors, a modulator, a transmitter, and a receiver.

A plate or foil type battery may be employed for the power supply of the microcomputer, the semiconductor memory, the single-chip computer, etc. of the laminated member. In this case, the laminated member may be provided with a switch so that the switch may be manually turned ON immediately before the laminated member is inserted in the carrying path or the switch may be automatically turned ON by the pressure applied by the carrying rollers or the like during the travel through the carrying path. Alternatively, a magnetic field may be formed in the card carrying path and the magnetic induction electromotive force generated when the laminated member is passed through the magnetic field is utilized to charge a capacitor and the electric charges accumulated in the capacitor may be employed for the power supply.

The third object of the present invention is achieved by a system for measuring the dimension of a gap for passing a card therethrough, comprising:

a laminated member which is passed through a path for said card, comprising an elastic mat having a stepped portion that gradually grows higher in steps from the front edge toward the rear edge thereof, a pressure measuring board that is placed on said elastic mat and has plural pressure sensors arranged along said steps, a single-chip computer incorporating a processor for processing the outputs of said pressure sensors, a modulator, a transmitter, a receiver, and an antenna;

a reader provided in the carrying path of said card to transmit and receive data and information to and from said laminated member by wireless, said reader comprising an external antenna, a transmitter, a receiver, a demodulator, and a microcomputer which processes the output of said demodulator and transmits and receives information to and from an external host computer; and the external host computer which is connected to said reader and that determines the distribution of received pressures according to received data to determine the dimension of said gap.

When the laminated member passes through the gap, an impact is applied to a point of the slope or stepped portion of the elastic mat at which the height is matched to the dimension or clearance of the gap. After that, the portion of the slope or stepped portion higher than that point is subjected to the pressure that gradually increases as the laminated member moves on and that is applied in the direction of the thickness of the laminated member.

Accordingly, the pressure change between the pressure detected by the pressure sensor located under the point (of the slope or the stepped portion) to which the impact was applied first and the pressure detected by the pressure sensor located under the point from which the height gradually increases among many pressure sensors on the pressure measuring board increases. The pressure change is processed by the processor and the result is stored in the memory before it is transferred to the external host computer later. Alternatively, the pressure change detected by the pressure sensors may be transmitted to the reader installed at the carrying path by wireless via the antenna, then transferred to the external host computer from the reader.

Based on the read data, the external host computer obtains the distribution of the pressures applied to the pressure measuring board when the laminated member passed through the gap so as to determine the dimension of the gap from the obtained pressure distribution. Analyzing changes in the direction of the card width or time-dependent changes of the pressure distribution observed when the laminated member goes through the gap makes it possible to determine whether the carrying path has been set properly, including how much the laminated member swings laterally during the passage.

BRIEF DESCRIPTION OF THE DRAWINGS

FIG. 3 is an illustration showing the principle of the first embodiment according to the present invention.

FIG. 20 is an illustration showing the principle of an eleventh embodiment in accordance with the present invention, wherein

DESCRIPTION OF THE PREFERRED EMBODIMENTS

First Embodiment

Figure 1:
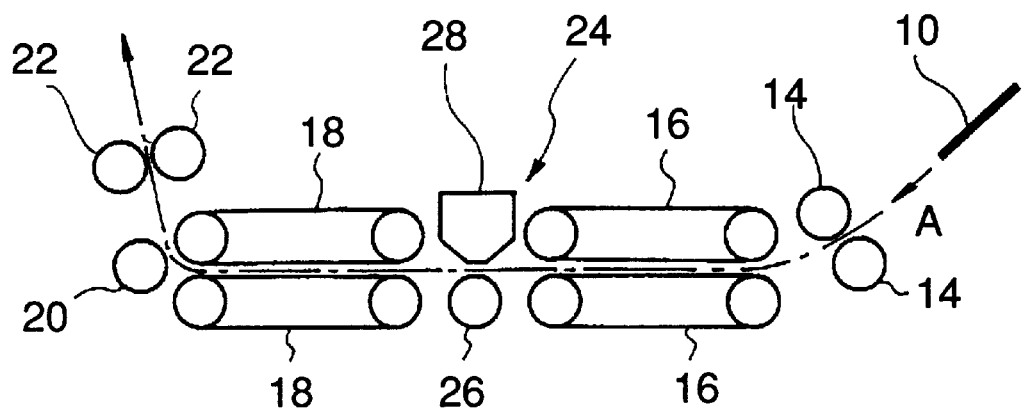
FIG. 1 is a diagram showing a card carrying path of an automatic ticket examining machine.
Figure 2:
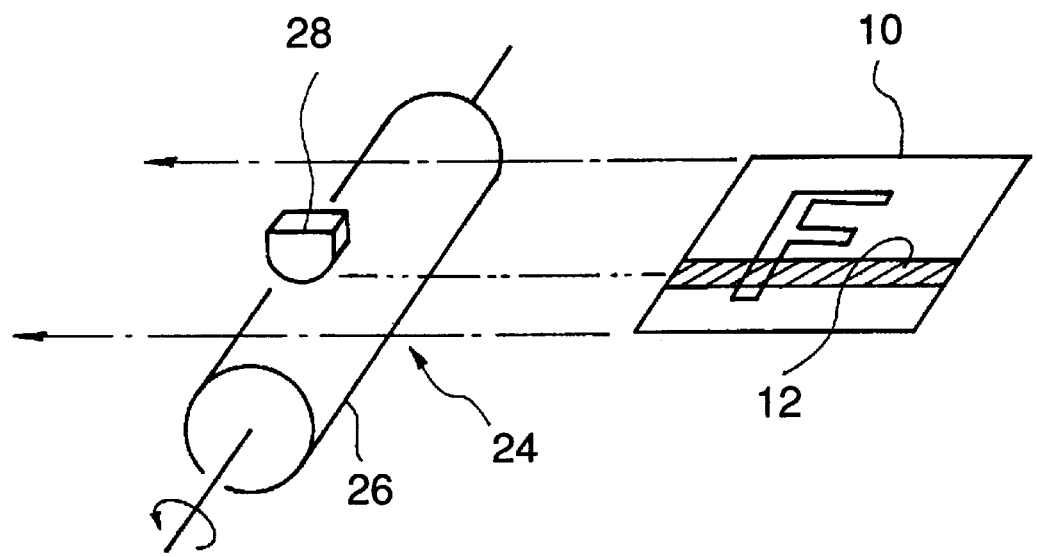
FIG. 2 is an enlarged perspective view showing the neighborhood of a magnetic head of the automatic ticket examining machine.
Figure 3A:
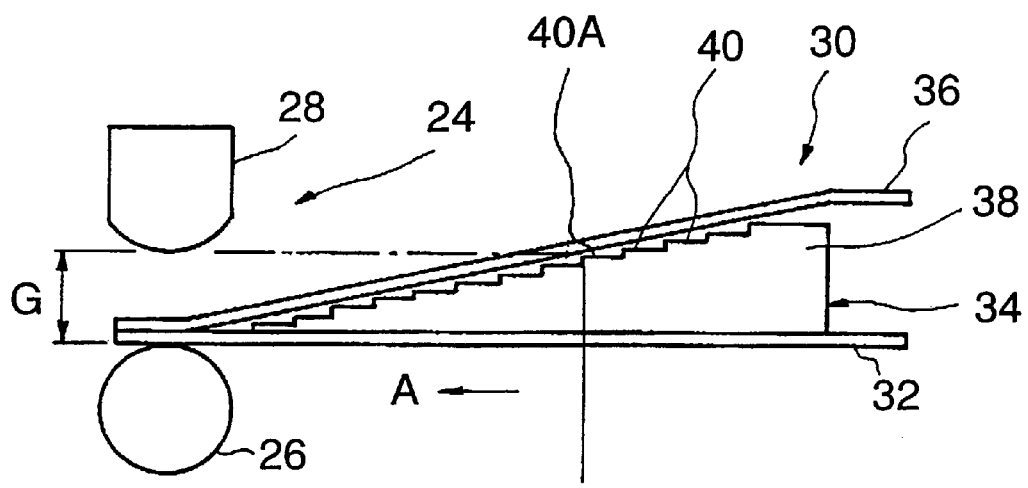
FIG. 3(A) is a side view and FIG. 3(B) is a plan view.
Figure 3B:
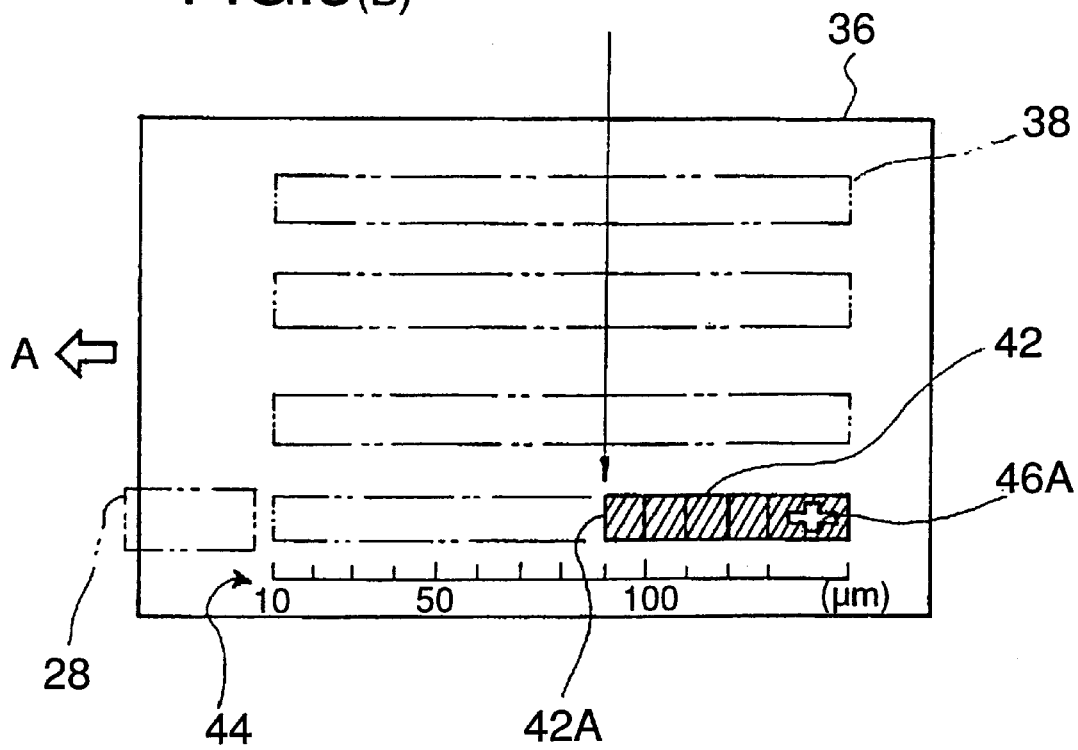
Figure 4:
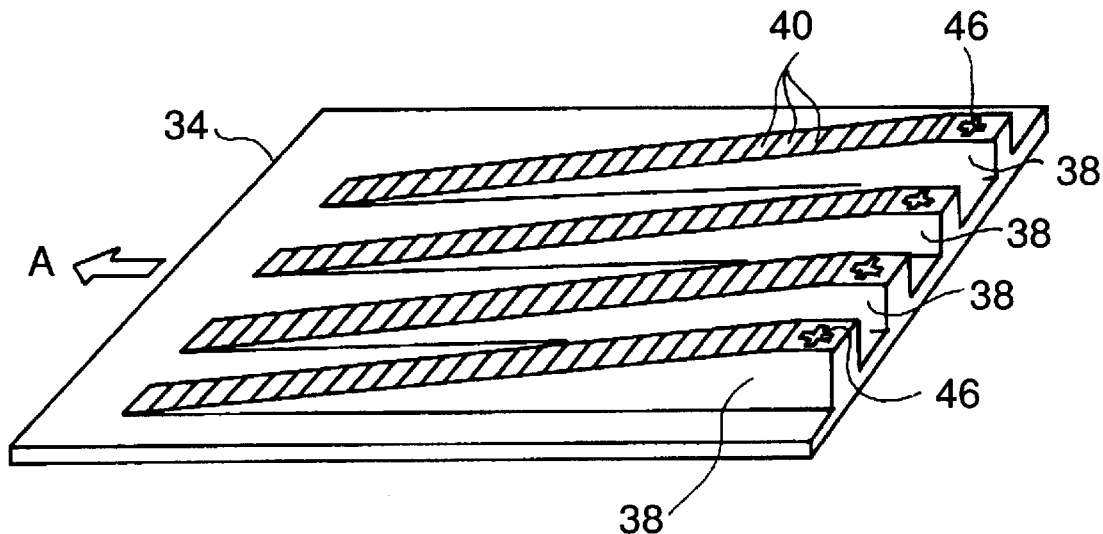
FIG. 4 is a perspective view of an elastic mat used in the first embodiment.
Figure 5:
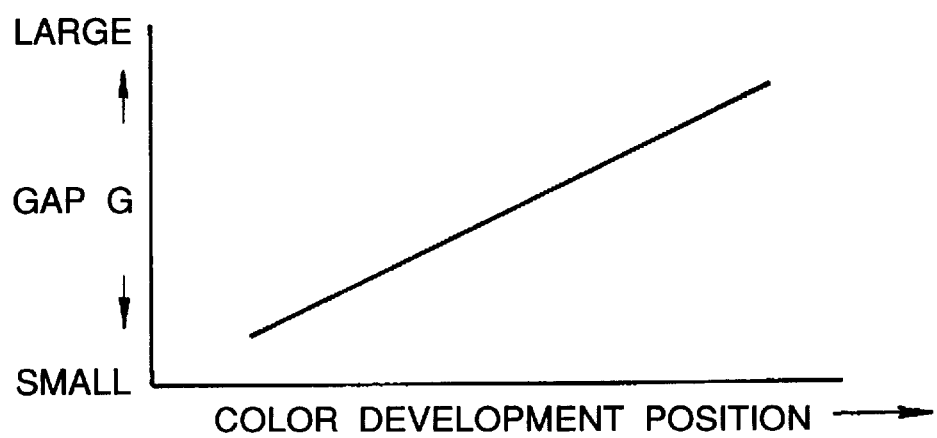
FIG. 5 is a diagram showing the relationship between the color developing position and the size of gap G.

FIG. 1 shows the card carrying path of an automatic ticket examining machine which is a first embodiment of the present invention; FIG. 2 is an enlarged perspective view showing the neighborhood of a magnetic head; FIG. 3(A) of FIG. 3 is a side view of a laminated member and FIG. 3(B) of FIG. 3 is a top plan view thereof, both illustrating the principle of the embodiment; FIG. 4 is a perspective view of an elastic mat; and FIG. 5 is a diagram showing the relationship between the color developing position of a pressure measuring film and the size of a gap.

A rectangular magnetic card 10 shown in FIGS. 1 and 2 is made of a plastic thin plate; formed on one surface thereof is a layer 12 to which magnetic powder has been coated. The layer 12 is provided in parallel to the direction in which the magnetic card 10 is inserted, that is, in parallel to the long sides of the card 10. An automatic ticket examining machine captures the card 10 through rollers 14 and 14, clamps it between carrying belts 16, 16 and 18, 18 to carry it, and ejects it through a guide roller 20 and ejecting rollers 22, 22.

A unit 24 for reading and writing data from and to the card 10 is installed between the carrying belts 16, 16 and 18, 18. More specifically, it has a carrying roller 26 which comes in contact with the surface of the card 10 that does not have the layer 12, and a magnetic head 28 which is opposed to the roller 26 and comes in close contact with the layer 12 of the card 10. The magnetic head 28 reads the data of the layer 12 and writes additional data to it as the card 10 passes it.

In this case, if the gap between the magnetic head 28 and the card 10 changes to be large, accurate reading or writing of data is interferred. If the gap is too small, then the card 10 is damaged or stuck. Hence, it is required to accurately control gap G (see FIG. 3) between the carrying roller 26 and the magnetic head 28 to ensure an appropriate contact pressure of the magnetic head 28 applied to the card 10.

In FIG. 3, reference numeral 30 denotes a laminated member for measuring the gap dimension. The laminated member 30 is composed of a sufficiently thin resinous board 32, an elastic mat 34 retained in close contact with the top surface of the board 32, and a pressure measuring film 36 covering the elastic mat 34.

The entire elastic mat 34 employed in this embodiment is made of, for example, silicone rubber; it has many projecting rows 38 that are arranged in stripes and that are parallel to inserting direction A of the card 10 as illustrated in FIG. 3 and FIG. 4. Formed on the top surfaces of the respective projecting rows 38 are steps 40 that gradually become shorter in inserting direction A. The heights and number of the steps 40 are determined by the dimension of gap G to be measured and detection accuracy. For instance, the difference between the steps 40 is set to 10 $\mu$m and the height of the highest steps 40 are set to approximately 150 $\mu$m.

The pressure measuring film 36 is adapted to develop a color only at a portion to which pressure has been applied; Prescale (trade name) marketed by Fuji Photo Film Co., Ltd. may be used as the pressure measuring film.

In the pressure measuring film 36, a film called film A, in which a color former layer containing a microcapsulated color former has been applied to the support medium thereof, is superimposed on a film called film C in which a developer has been applied to the support medium thereof. By breaking the microcapsule at the portion subjected to pressure, the color former released from the ruptured microcapsules is absorbed to the developer so as to develop, for example, a red color by chemical reaction. This is known as "two-sheet type pressure measuring film". There is also available a "mono-sheet type" wherein a developer and a microcapsulated color former are coated on a single sheet, and the microcapsule at the portion subjected to pressure is destroyed to cause the color former released from the ruptured microcapsules to react to the developer.

The pressure measuring film 36 is able to measure different pressure levels by using microcapsules which have different wall thicknesses to be ruptured upon application of different pressure levels. There should be no problem with using the two-sheet type. Preferably, however, the mono-sheet type should be used because it is easier to handle.

The pressure measuring film 36 is placed on the elastic mat 34 mounted on the board 32 to form the laminated member 30 composed of the three layers; the laminated member is inserted between the capturing rollers 14 and 14 shown in FIG. 1. Then, the laminated member 30 advances into gap G between the roller 26 and the magnetic head 28.

The front portion of the laminated member 30 is made thinner and the rear portion is made thicker than gap G. Accordingly, in the laminated member 30, a step 40A that is as high as gap G bumps against the magnetic head 28, so that the bumping step 40A causes the pressure measuring film 36 to develop a color.

The step 40 grows higher toward the rear thereof, meaning that all the steps 40 beyond the step 40A will develop the color. The part (B) of FIG.3 shows a portion 42 which has developed the color including a spot 42A which has developed the color and which corresponds to the step 40A.

Hence, the size of gap G can be determined from the height of the step 40A which has first developed the color. To make use of the step 46A, a scale 44 shown in FIG. 3, for example, is printed on the pressure measuring film 36 in advance so as to measure the gap dimension from the scale 44. In FIG. 3, the reading on the scale is 90 μm.

Providing the highest steps 40 on the top surfaces of the projecting rows 38 with recessed marks 46 shown in FIG. 4 allows the marks 46 to be transferred to the pressure measuring film 36 when passing through gap G. In this case, a transferred image 46A of the mark 46 is recorded in the color-developed portion 42 of the film 36; hence, the position of the color-developed spot 42A corresponding to the step 40A can be accurately known by using the transferred image 46A as the reference.

Once the position of the color-developed spot 42A corresponding to the step 40A has been determined, the dimension of gap G can be determined according to FIG. 5. The conversion characteristic diagram shown in FIG. 5 is prepared beforehand for each type of laminated member 30 to be used.

In this embodiment, the elastic mat 34 is provided with four projecting rows 38, considering that there can be a total of four different inserting directions of the card 10 including a case where the opposite direction from inserting direction A and two other cases where the card is inserted with its face up and down, respectively. In other words, the elastic mat 34 can be commonly used regardless of the type of the card 10 which has a different position of the layer 12.

Thus, according to the method for measuring the dimension of a gap in accordance with the first embodiment, the pressure measuring film is superimposed on the elastic mat having the projecting rows that become lower in the direction in which the card is inserted, and passed through the gap so as to cause the pressure measuring film to develop a color at the point that corresponds to the dimension of the gap. This enables the dimension of the gap to be measured by detecting the point at which the color has been developed.

Therefore, the dimension of the gap can be quickly and accurately measured by an extremely easy operation, resulting in a markedly higher efficiency in performing the adjustment of the gap. Furthermore, objective, precise adjustment of the gap can be achieved without depending on the intuition of maintenance personnel.

In this case, it is preferable to provide the elastic mat with a plurality of projecting rows in stripes that are parallel to the card inserting direction and to provide the top surfaces of the projecting rows with steps.

Second, Third, Fourth and Fifth Embodiments

Figure 7:
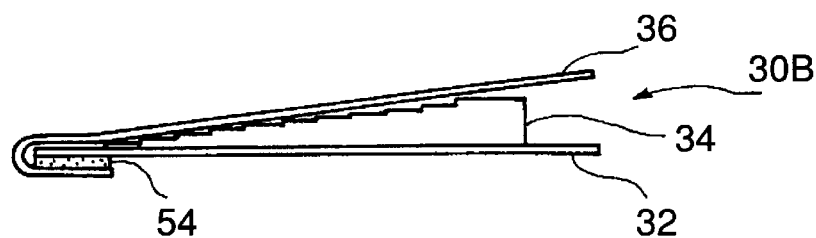
FIG. 7 is a side view showing a third embodiment of the laminated member.
Figure 8:
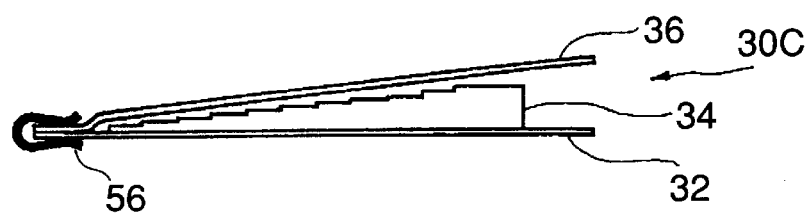
FIG. 8 is a side view showing a fourth embodiment of the laminated member.
Figure 9:
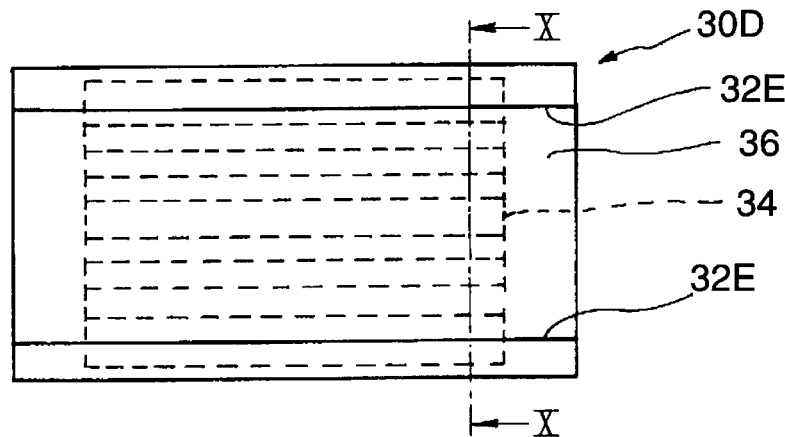
FIG. 9 is a top plan view showing a fifth embodiment of the laminated member.
Figure 10:
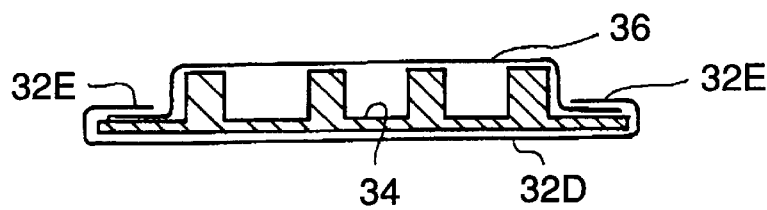
FIG. 10 is a sectional view taken at line X—X in FIG. 9.

FIGS. 6 through 9 show other embodiments of the laminated member 30; and FIG. 10 is a sectional view taken at line X—X in FIG. 9. When the laminated member 30 goes into gap G, a force is produced that pushes the pressure measuring film 36 and the elastic mat 34 backward, i.e. in the opposite direction from inserting direction A. This may disturb the relative positions of the film 36 and the elastic mat 34. The embodiments shown in FIG. 6 through FIG. 10 are designed to prevent the foregoing relative positions from being disturbed.

Figure 6:
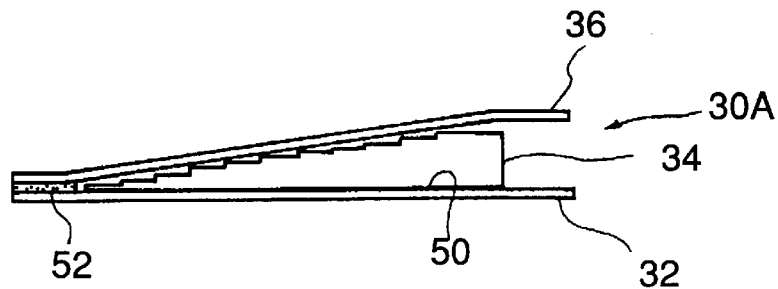
FIG. 6 is a side view showing a second embodiment of a laminated member.

A laminated member 30A of the second embodiment shown in FIG. 6 is composed of the board 32 and the elastic mat 34 glued together with an adhesive layer 50, the front edge of the pressure measuring film 36 being detachably fixed to the board 32 with an adhesive layer 52.

A laminated member 30B of the third embodiment shown in FIG. 7 has the front edge of the pressure measuring film 36 folded and bonded to the bottom surface of the front edge of the board 32, reference numeral 54 being an adhesive layer.

A laminated member 30C of the fourth embodiment shown in FIG. 8 has the front edge of the pressure measuring film 36 and the front edge of the board 32 clamped with a clip 56.

In a laminated member 30D of the fifth embodiment shown in FIGS. 9 and 10, both side edges of a board 32D folded back onto the top surfaces of both side edges of the elastic mat 34, and both side edges of the pressure measuring film 36 are held between folded portions 32E and the elastic mat 34.

Sixth, Seventh, and Eighth Embodiments

Figure 11:
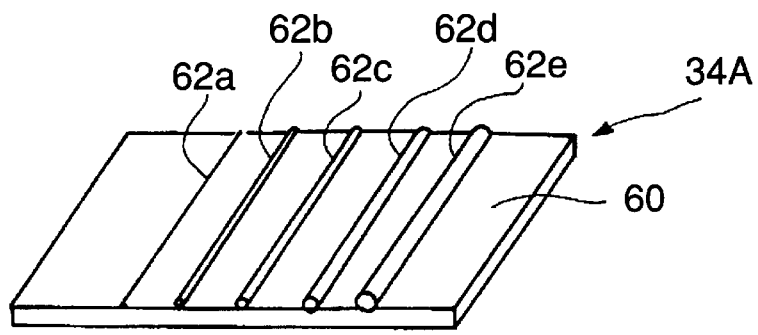
FIG. 11 is a perspective view showing a sixth embodiment of an elastic mat.
Figure 12:
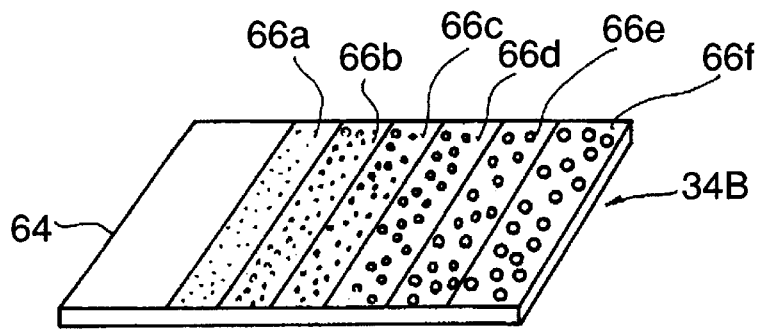
FIG. 12 is a perspective view showing a seventh embodiment of the elastic mat.
Figure 13:
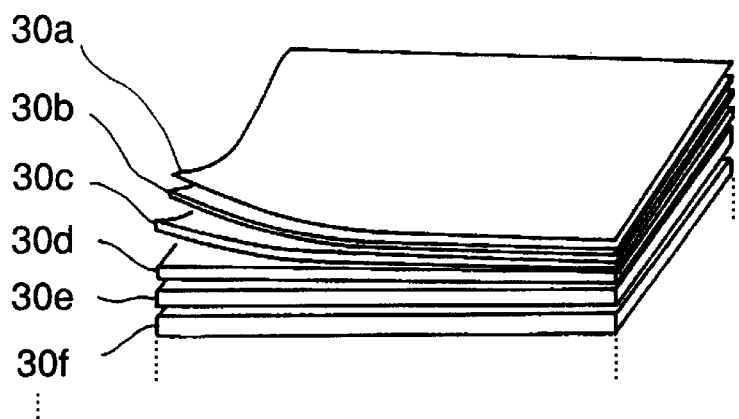
FIG. 13 is a perspective view showing a set of laminated members which is an eighth embodiment of the present invention.

FIGS. 11 through 13 show the sixth, seventh, and eighth embodiments of the elastic mat. An elastic mat 34A of the sixth embodiment shown in FIG. 11 has wires 62 (62a, 62b, 62c, 62d, and 62e) having different diameters which are arranged and secured on an elastic sheet 60, which has a uniform thickness, in parallel at equal intervals in the order of the size of the diameter.

An elastic mat 34B of the seventh embodiment illustrated in FIG. 12 uses granules of different diameters to form steps on an elastic sheet 64 of a uniform thickness. More specifically, the granules are secured at fixed widths from the leading edge in the order from granules 66a having the smallest diameter to granules 66f having the largest diameter.

FIG. 13 shows the eighth embodiment which is a set of laminated members 68 that combines laminated members 30a, 30b, and so on having different thickness, while each having a uniform thickness. The laminated members 68 are always used as a set. More specifically, beginning with the thinnest laminated member 30a, the laminated members 30b, 30c, and so on are inserted in sequence between the capturing rollers 14 and 14 shown in FIG. 1 to measure the laminated member having the thickness which triggers the color development.

According to the method of the eighth embodiment, the laminated member having the thickness at which the color development is triggered is determined to find the dimension of the gap; hence, the dimension of the gap can be quickly and accurately measured by an extremely easy operation as in the embodiments described above, permitting markedly higher efficiency of gap adjustment to be achieved. Furthermore, objective, precise adjustment of the gap can be achieved without depending on the intuition of maintenance personnel.

Ninth Embodiment

Figure 14:
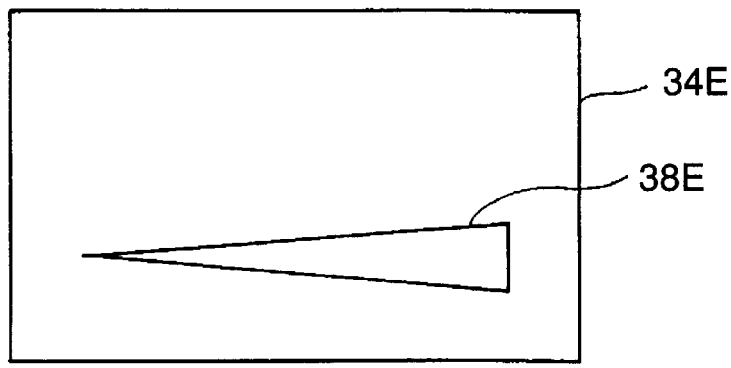
FIG. 14 is a top plan view showing a ninth embodiment of the elastic mat.
Figure 15:
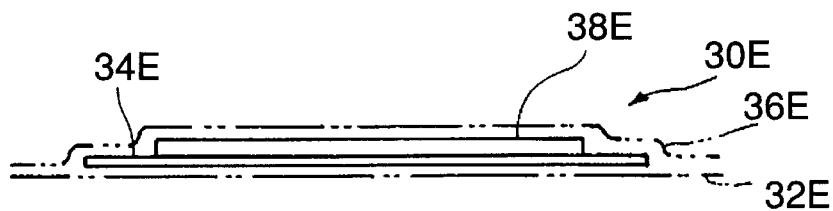
FIG. 15 is a side view showing the elastic mat of the ninth embodiment of FIG. 14.
Figure 16:
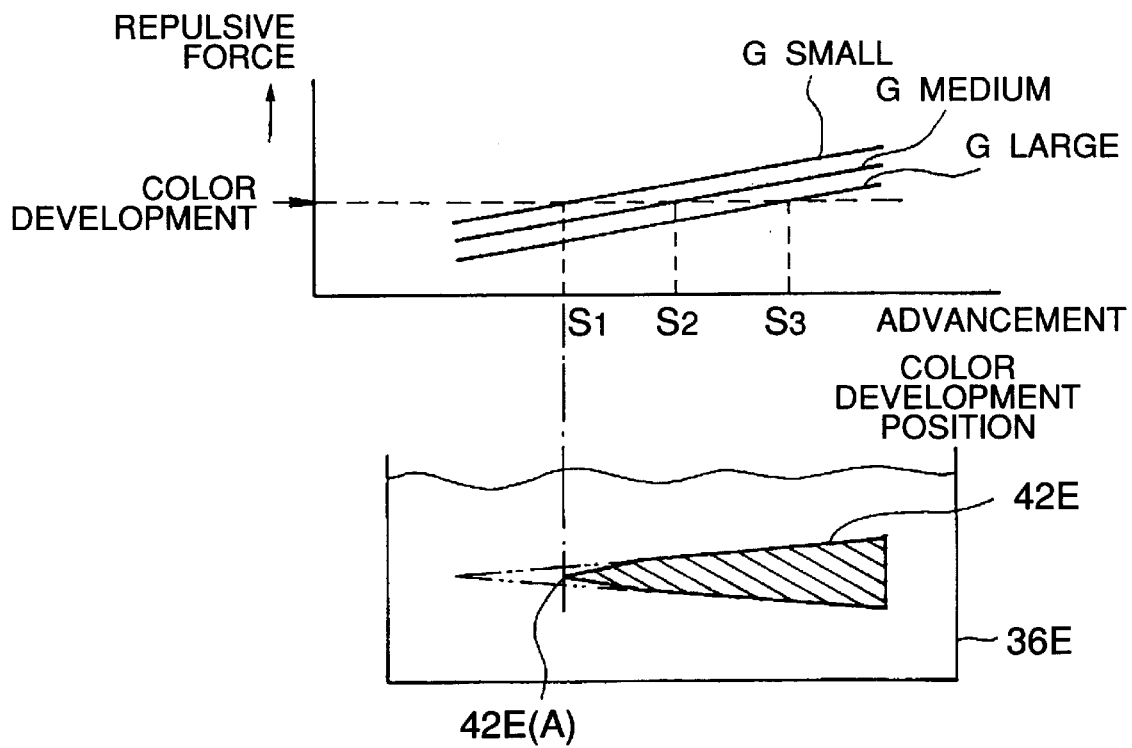
FIG. 16 is a diagram illustrating the principle of the ninth according to the present invention.

FIG. 14 is a top plan view showing the ninth embodiment of the elastic mat; FIG. 15 is a side view of the embodiment of the elastic mat; and FIG. 16 is a diagram illustrating the principle of the elastic mat. An elastic mat 34E has a projecting row 38E shaped like a wedge as observed from above which is narrower toward the front edge, i.e. in card inserting direction A. The projecting row 38E is flat, having a constant height.

When the laminated member 30E that has the elastic mat 34E placed between a board 32E and a pressure measuring film 36E is advanced into gap G, the repulsive force of the projecting row 38E increases as the laminated member advances further because the width of the projecting row 38E which is compressed and deformed by the magnetic head 28 increases as the laminated member comes in further. The repulsive force of the projecting row provides the pressure applied to a pressure measuring film 36E.

Accordingly, as illustrated in FIG. 16, when gap G is small, a small advancement $S_1$ causes the repulsive force to reach a pressure level at which the film 36E develops a color. As gap G grows larger, the advancement for generating a sufficiently high pressure to cause the color development accordingly increases as $S_2$ and $S_3$. Thus, the relationship between the color development positions and gap G is the same as that shown in FIG. 5. Hence, the dimension of gap G can be measured by measuring the position of a leading edge, i.e. the point where the color is developed, 42E(A) of a color-developed portion 42E of the pressure measuring film 36E.

According to the method of the ninth embodiment, the elastic mat that has a uniform thickness and that is adapted to produce repulsive force which gradually weakens with respect to the same gap in the direction in which the card is inserted is employed; hence, the dimension of the gap can be quickly and accurately measured by the extremely easy operation as in the embodiments described above.

Tenth Embodiment

Figure 17:
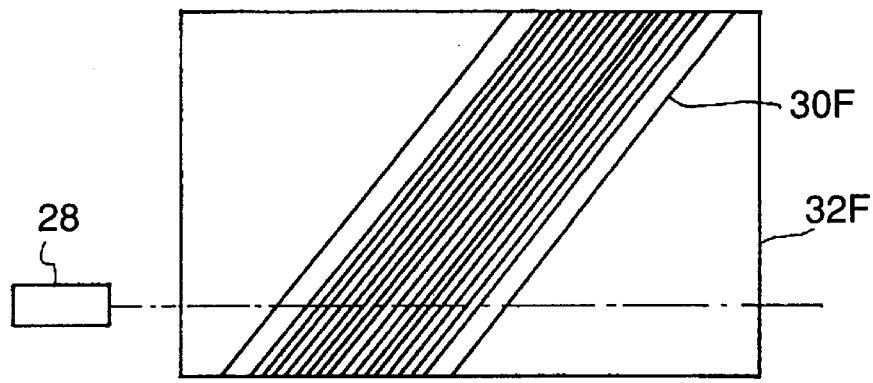
FIG. 17 is a top plan view showing a tenth embodiment of the laminated member.
Figure 18:
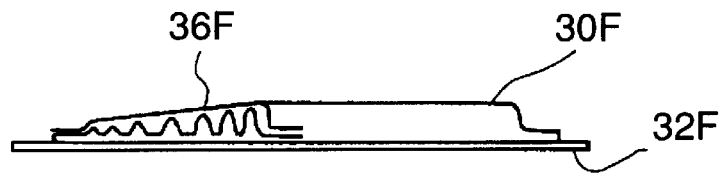
FIG. 18 is a side view showing the tenth embodiment.
Figure 19:
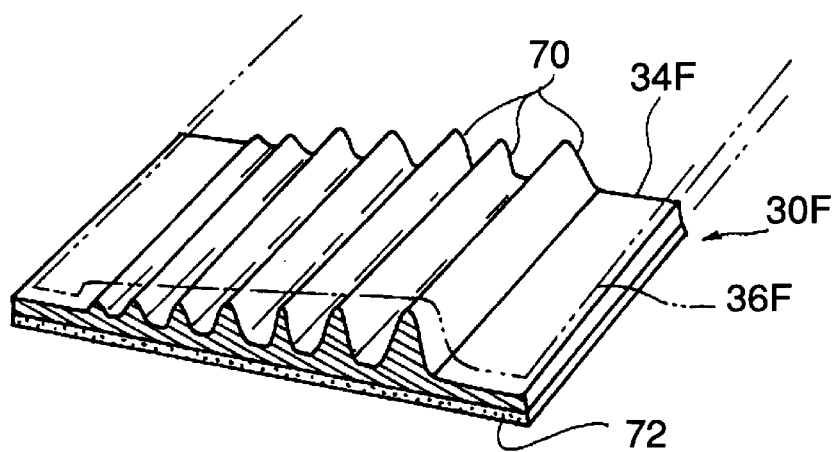
FIG. 19 is a perspective view showing a tape-shaped laminated member used for the tenth embodiment.

FIG. 17 is a top plan view showing the tenth embodiment and FIG. 18 is a side view thereof. FIG. 19 is a perspective view of a tape-shaped laminated member employed for the embodiment.

In the tenth embodiment, a laminated member 30F is shaped like a tape and it is glued onto a board 32F, the thickness of which has been measured in advance. The tape-shaped laminated member 30F has an elastic mat 34F having many projecting portions 70 that are arranged in parallel to the length thereof and that gradually increase in height widthwise, a pressure measuring film 36F covering the top surface of the elastic mat, and an adhesive layer 72 applied to the bottom surface of the elastic mat 34F. The pressure measuring film 36F is made of a transparent film so as to permit the color development point to be measured from outside.

The laminated member 30F is pasted to the board 32F, the thickness of which has been known, and it is passed through gap G. This makes it possible to cause the pressure measuring film 36F to develop a color at a point that corresponds to the dimension of gap G. After that, the distance from the edge of the laminated member 30F to the point where the color has been developed is measured to determine the dimension of gap G at the point where the color has been developed.

The tenth embodiment can be applied even when the position of the magnetic head 28 is unknown. More specifically, the laminated member 30F can be employed by pasting it crosswise onto the board 32F which has the same horizontal and vertical dimensions as the card 10 shown in FIGS. 1 and 2 and which is sufficiently thin. The laminated member 30 may be pasted in an orthogonal or oblique direction with respect to the board 32F. Pasting the laminated member in the oblique direction provides a longer track crossing the magnetic head 28, leading to higher detection accuracy of the color development point.

Eleventh Embodiment

Figure 20A:
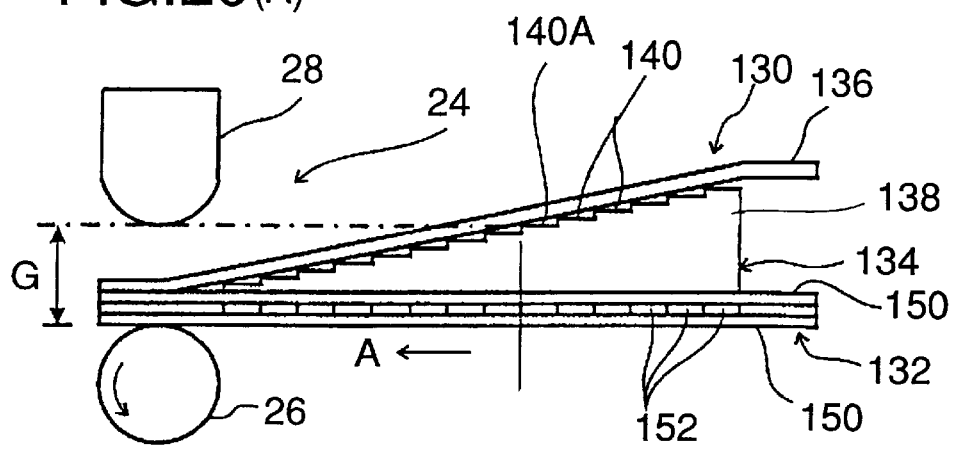
FIG. 20(A) is a side view.
Figure 20B:
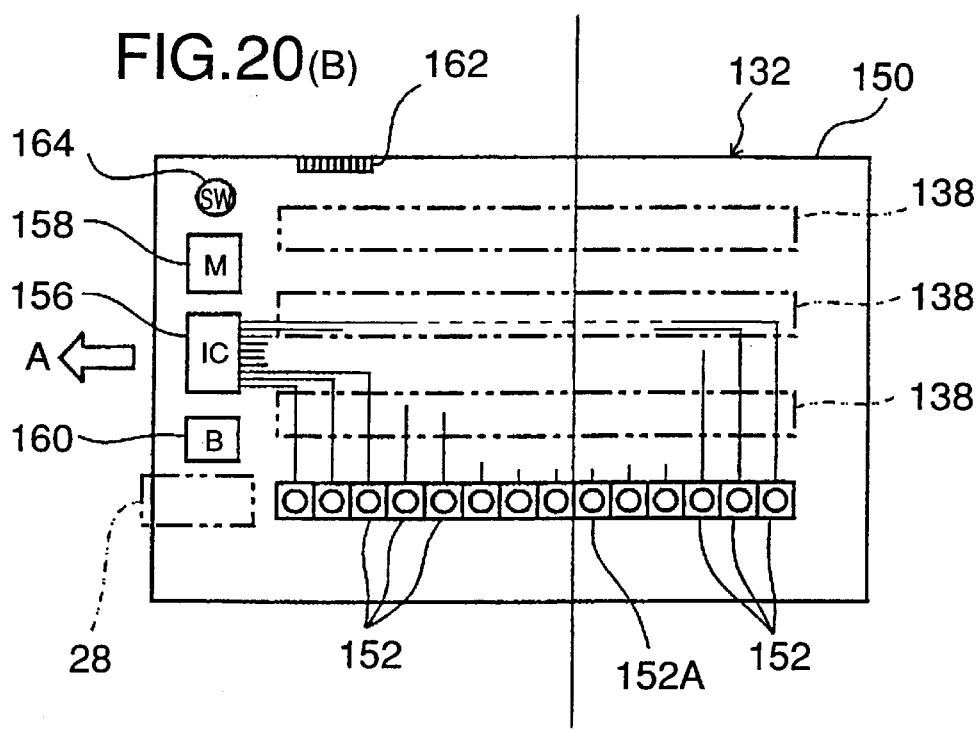
FIG. 20(B) is a top plan view and FIG. 20(C) is a chart showing the change in detected pressure.
Figure 20C:
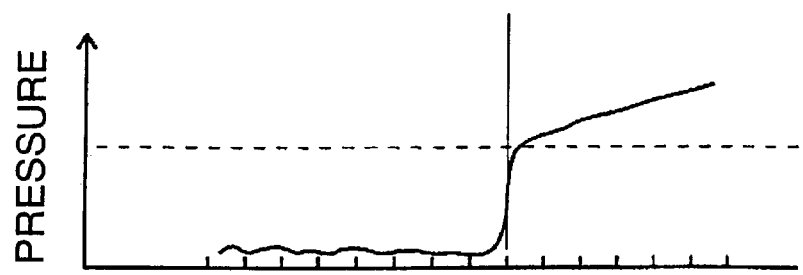
Figure 21:
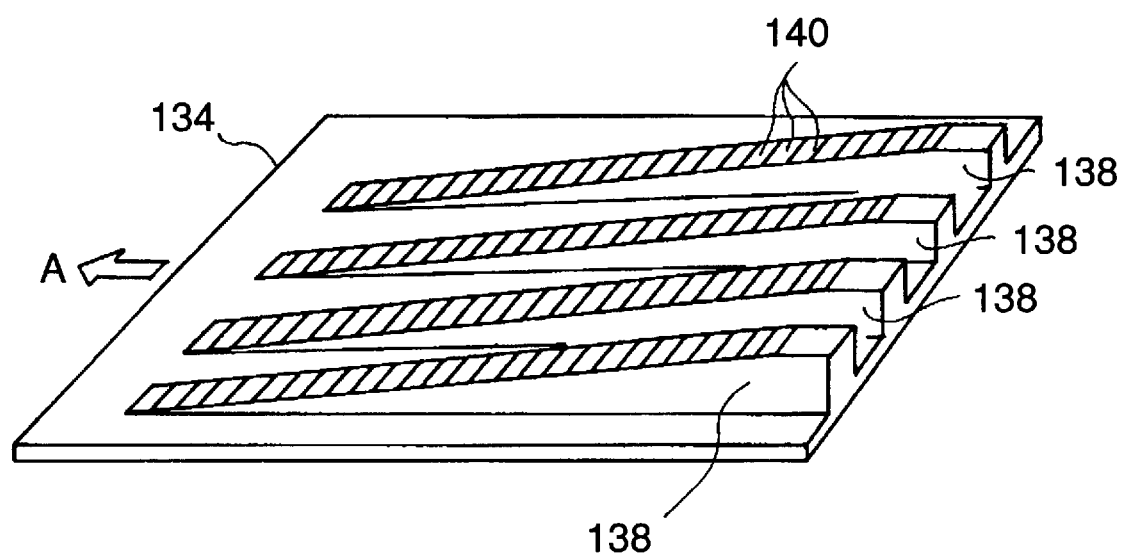
FIG. 21 is a perspective view of the elastic mat used for the eleventh embodiment.

FIGS. 20A through 20C illustrate the principle of the eleventh embodiment of the present invention; and FIG. 21 is a perspective view of an elastic mat used for the eleventh embodiment. FIG. 20A is a side view of a laminated member; FIG. 20B is a top plan view thereof; and FIG. 20C shows the changes in detected pressure. The constructions of the card carrying path and the neighborhood of the magnetic head of the automatic ticket examining machine to which the eleventh embodiment is applied are the same as those of the first embodiment shown in FIG. 1 and FIG. 2 and therefore the description. thereof will be omitted.

Reference numeral 130 shown in FIG. 20A denotes a laminated member for measuring the dimension of a gap. The laminated member 130 is composed of a pressure measuring board 132, which will be described in detail hereinafter, an elastic mat 134 held in close contact on the board 132, and a sufficiently thin film 136 covering the elastic mat 134.

The entire elastic mat 134 is made of, for example, silicone rubber; it has many projecting rows 138 in stripes that are parallel to an inserting direction A of a card 10 as shown in FIG. 20A and 20B and FIG. 21. Formed on the top surfaces of the respective projecting rows 138 are steps 140 that gradually become lower in the inserting direction A. The heights and number of the steps 140 are determined by the dimension of gap G to be measured and detection accuracy. For instance, the difference between the respective steps 140 is set to 10 $\mu$m and the height of the highest steps 140 is set to approximately 150 $\mu$m.

The pressure measuring board 132 will now be described. The board 132 has a pair of upper and lower sheets 150 and 150 formed using polyester film or other resinous film and many pressure sensors 152 held between the two sheets 150 and 150. The pressure sensors 152 are arranged in the lengthwise direction, i.e. the feeding direction, of the laminated member 130 to match the projecting rows 138 of the elastic mat 134. In other words, each of the pressure sensors 152 corresponds to each of the steps 140 of the projecting rows 138.

A total of four groups of pressure sensors 152 may be provided to match all the projecting rows 138, each group being arranged along each of the projecting rows 138; however, if the position of a magnetic head 28 is decided in advance, then providing just one group of pressure sensors 54 for the projecting row 138 with which the magnetic head 28 comes in contact should be adequate. In this case, the remaining projecting rows 138 do not contribute to the detection of the pressures; however, they help to stabilize the transport of the laminated member 130 because the carrying rollers come in uniform contact with all the projecting rows 138 to apply pressure when the laminated member 130 is carried.

Load cells may be used for the pressure sensors 152; the load cells may be constructed, for example, so that the displacement of a movable plate such as a diaphragm which is displaced under pressure is detected by a strain gauge pasted to the movable plate. The pressure sensors 152 may alternatively be carrier diffusion type semiconductor pressure sensors. The carrier diffusion type semiconductor pressure sensors are fabricated by thermally diffusing a strain resistive material in a predetermined pattern by applying a semiconductor manufacturing technique on the surface of a diaphragm composed of silicon monocrystal. The characteristic of the carrier diffusion type semiconductor pressure sensors is utilized in which a change in pressure causes a change in the electrical resistance of the strain resistive material by the strain applied to the strain resistive material.

Further held between the upper and lower sheets 150 and 150 are a microcomputer 156, a semiconductor memory 158, a battery 160, an external connection terminal 162, a switch 164, etc. as shown in FIG. 20(B). The microcomputer 156 amplifies the output signals of the pressure sensors 152 and converts them to digital signal of, for example, 8 bits (256 steps) before storing them in the memory 158. The switch 164 is turned ON either by hand or by being pressed by the carrying rollers to put primarily the computer 156 and the memory 158 in operation for a fixed time to enable the detection of the pressures and storage in memory after they are reset.

With such construction, when the laminated member 130 is inserted in the card carrying path and passed through the gap between the magnetic head 28 and a roller 26, the pressure applied to a pressure sensor 152A positioned at a step 140A (shown in FIG. 20(A)) of the elastic mat 134, which step corresponds to the dimension of the gap, increases. As the laminated member 130 moves along, the pressure applied to the pressure sensors 152 corresponding to the steps 140 which gradually grow taller increases. The pressure signals of these pressure sensors 152A and 152 are read into the microcomputer 156 where they are converted to digital signals to be stored in the memory 158.

When the laminated member 130 is ejected from the carrying path, the terminal (not shown) for the external connection terminal 162 is connected so that the contents of the memory 158 are read into the external host computer (not shown). The external host computer uses the read data to analyze the pressure distribution to determine dimension G of the gap from the pressure distribution. For example, as illustrated in FIG. 20(C), pressure P applied to the points where the pressure sensors 152 are located, then the step 140A at which pressure P suddenly increases is determined. Dimension G of the gap can be obtained from the height of the step 140A.

Thus, in the eleventh embodiment, the elastic mat, which becomes thinner in the card inserting direction, is superposed on the pressure measuring board provided with many pressure sensors in the card inserting direction so that it covers at least the pressure sensors, and this laminated member is passed through the gap. The pressures detected by the pressure sensors when the laminated member is passed through the gap are stored, then the stored data is read out to obtain the pressure distribution, thus allowing the dimension of the gap to be determined from the pressure distribution.

Hence, the dimension of the gap can be quickly and accurately measured by the extremely easy operation with resultant markedly higher efficiency of the gap adjustment. Further, objective, precise adjustment of the gap can be achieved without depending on the intuition of maintenance personnel. In particular, by making the pressure sensors so that they permit the pressure to be detected continuously or in multiple steps and by making it possible to store the pressure in multiple steps, the pressure distribution in the direction of the laminated member or card or the dynamic pressure changes occurring while the laminated member or card is being carried can be detected in further detail, thus leading to even higher accuracy of the gap adjustment.

The laminated member is provided with the memory for storing pressures, and after the laminated member passes through the gap, the data stored in the memory is transferred to the external host computer wherein the pressure distribution is determined to analyze the carrying condition. The transfer of the data between the memory and the external host computer may be performed by connecting them with the wiring cable via the connecting terminal or a connector; or it may alternatively be performed in a non-contact fashion by wireless via the antennas provided on the laminated member and the carrying path as in a twelfth embodiment which will be discussed later. The pressure sensors may be one-dimensionally arranged in the carrying direction or lengthwise direction of the card, or they may alternatively be arranged two-dimensionally.

The battery provided on the laminated member can be used as the power supply of the pressure measuring board of the laminated member; a plate or film type battery may suitably be used. As an alternative, a capacitor for temporarily accumulating electric charges may be used for the battery; in this case, the capacitor should be charged before the laminated member is used.

Twelfth Embodiment

Figure 22:
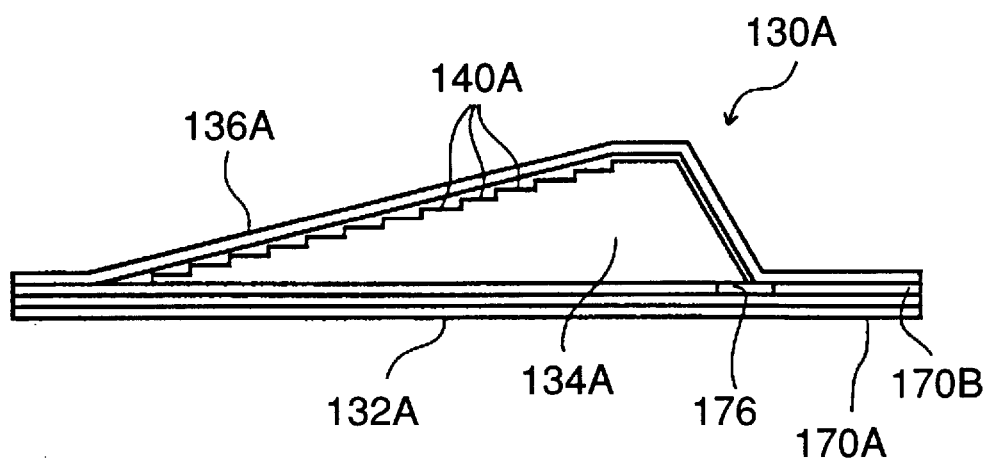
FIG. 22 is a side sectional view of the laminated member used for a twelfth embodiment.
Figure 23:
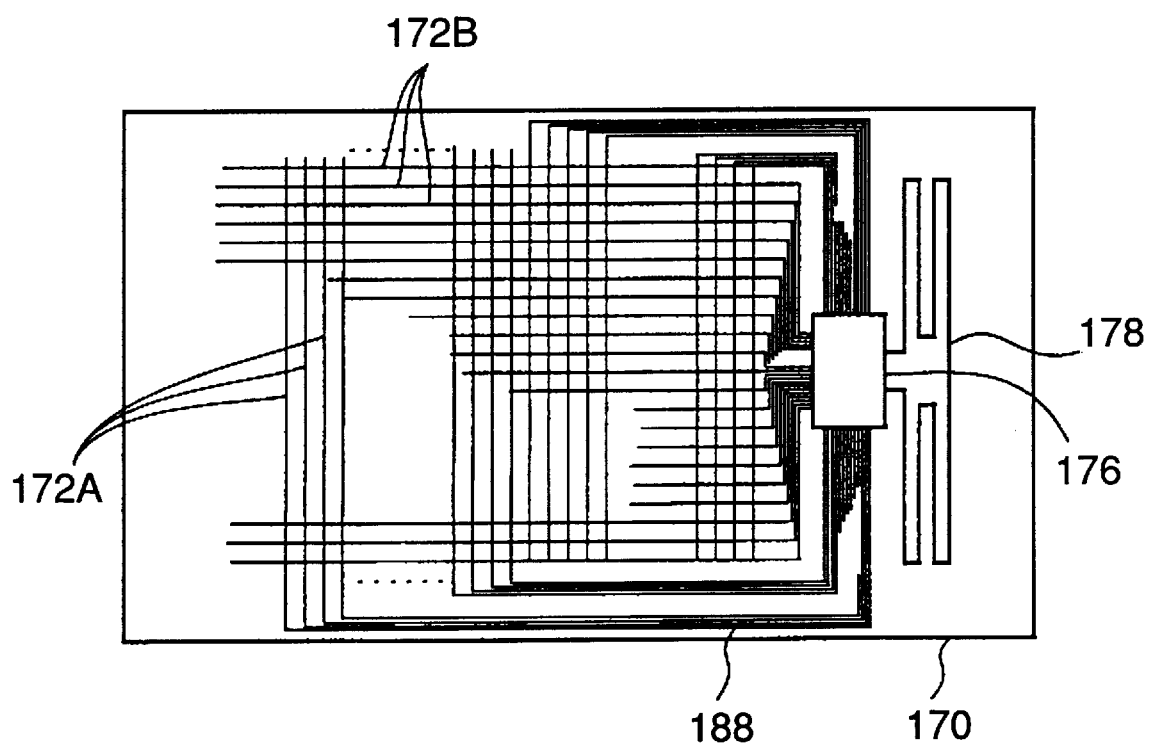
FIG. 23 is a top plan view showing the internal constitution of the pressure measuring board used for the laminated member of the twelfth embodiment.
Figure 24:
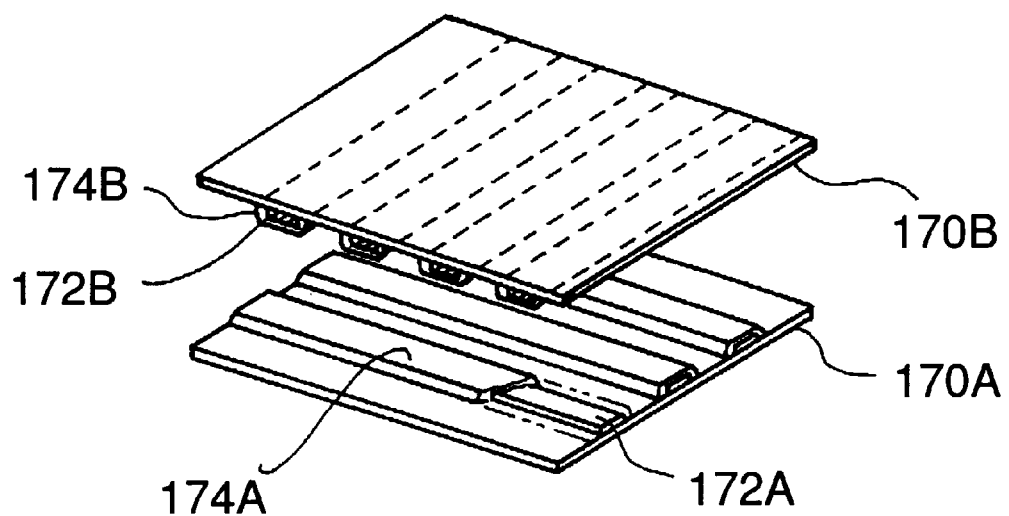
FIG. 24 is an assembly view showing the constitution of the pressure sensor section of the pressure measuring board of the twelfth embodiment.
Figure 25:
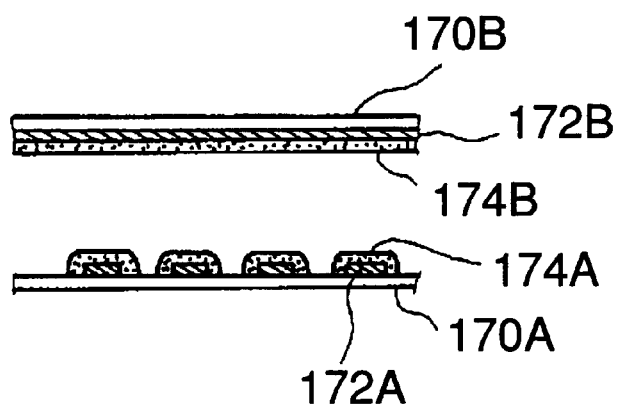
FIG. 25 is an exploded sectional side view showing the constitution of the pressure sensor section of the pressure measuring board of the twelfth embodiment.
Figure 26:
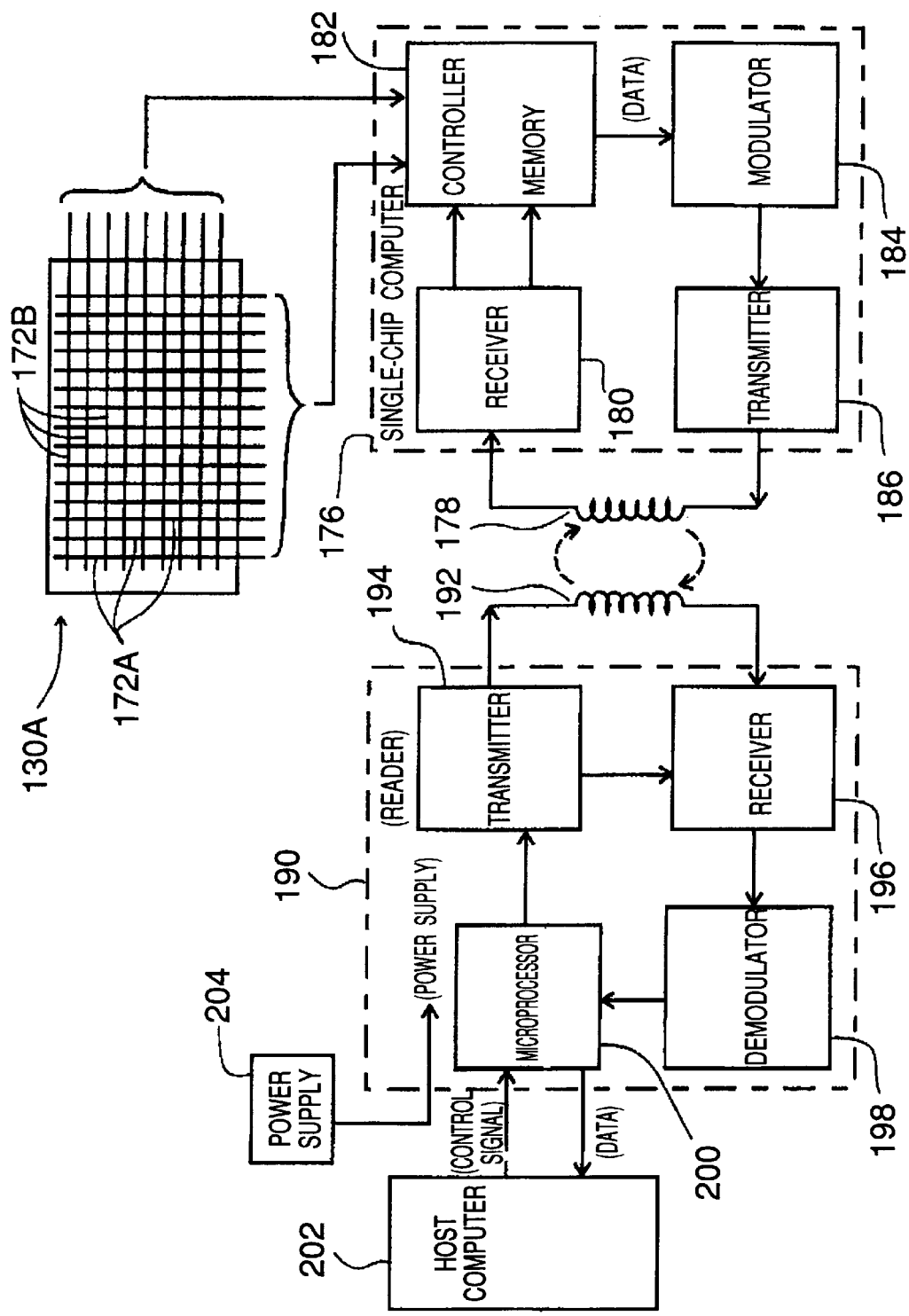
FIG. 26 is a block diagram showing the entire constitution of a gap dimension measuring system in accordance with the twelfth embodiment.
Figure 27A:
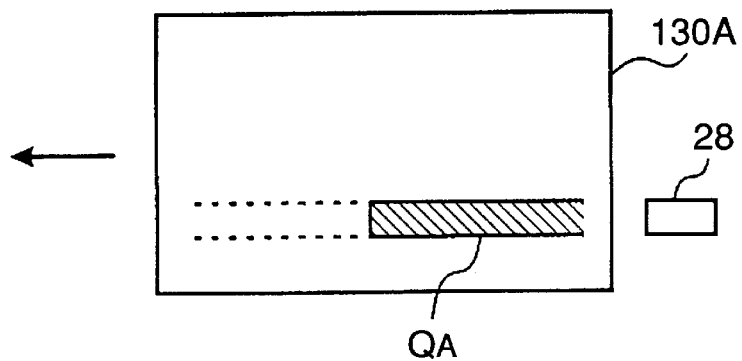
FIGS. 27A, 27B, and 27C show the examples of the detection results of the pressure distribution by the twelfth embodiment.
Figure 27B:
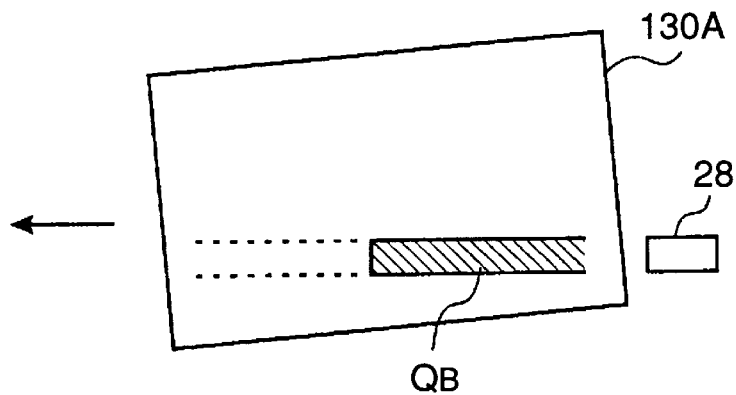
Figure 27C:
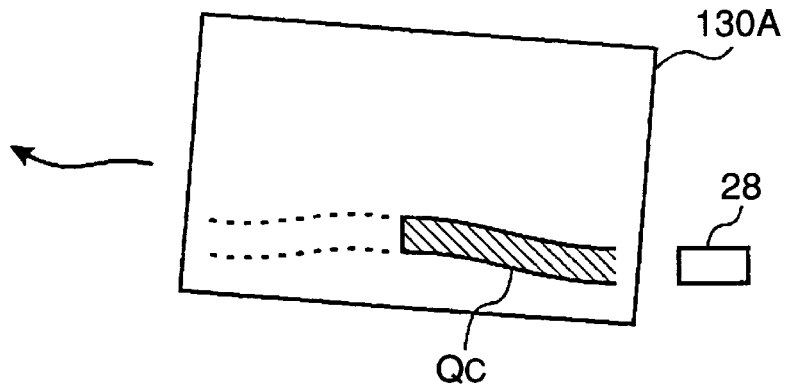

FIG. 22 is a side sectional view of a laminated member employed for the twelfth embodiment; FIG. 23 is a top plan view showing the internal constitution of a pressure measuring board used for the laminated member; FIG. 24 is an assembly view showing the constitution of pressure sensors; FIG. 25 is a side sectional view of the pressure sensors; FIG. 26 is a block diagram showing the entire constitution of a gap dimension measuring system employing the laminated member; and FIGS. 27A, 27B, and 27C are diagrams illustrating the output examples of detection results.

Reference numeral 130A shown in FIG. 22 denotes a laminated member; the laminated member 130A has a pressure measuring board 132A and a film 136A superposed on the bottom surface and the top surface, respectively, of an elastic mat 134A. The elastic mat 134A used in this embodiment may be the same as the elastic mat 134 shown in FIG. 21; preferably, however, it has steps 140 continuously arranged widthwise or in the direction of the short sides of the board 132A. More specifically, the pressure measuring board 132A is able to two-dimensionally detect the pressure distribution as it will be discussed later; therefore, arranging the steps 140 widthwise continuously makes it possible to obtain two-dimensional pressure distribution.

As shown in FIG. 24, the pressure measuring board 132A is composed of two sheets, each sheet being made as follows: many parallel thin-wire electrodes 172 (172A and 172B) are formed on one surface of each of insulating sheets 170 (170A and 170B) made of polyester film or the like, and the electrodes 172 are covered with thin films 174 (174A and 174B) made of pressure-sensitive resistive ink. These two sheets 170A and 170B are placed together facing against each other so that the electrodes 172A and 172B are orthogonalized with each other (see FIGS. 24 and 25). The thin films 174 composed of pressure-sensitive resistive ink have characteristics such that the electrical resistance varies according to the level of pressure applied thereto. Because of this characteristic, the intersections of the electrodes 172A and 172B provide pressure sensors. More specifically, since the intersections are two-dimensionally distributed in a matrix pattern, the use of the board 132A enables two-dimensional pressure distribution.

The pressure-sensitive resistive ink used for this purpose may be the one disclosed, for example, in Japanese Unexamined Patent Publication Nos. 5-248971, 3-501221 and 62-502665; the one that is composed of, for instance, an aceton solvent with graphite added. A preferred embodiment is composed of a mixture of a conductive ink containing graphite, vinyl resin, and butyl Cellosolve acetate and an insulating ink containing a titanium dioxide filler, a vinyl resin binder, and a butyl Cellosolve acetate solvent. The gap between the electrodes 172A and 172B may be set to 1.27 mm (0.05 inch); it is obvious, however, the gap can be changed according to the required resolution of pressure distribution.

A single-chip computer 176 and an antenna 178 are provided between the insulating sheets 170A and 170B. The single-chip computer 176 has a receiver 180, a controller 182 having a built-in memory, a modulator 184, and a transmitter 186 as shown in FIG. 26. The electrodes 172A and 172B are connected to the data input terminal of the computer 176 through a circuit pattern 188 formed on the sheets 170A and 170B (see FIG. 23). The circuit pattern 188 as well as the electrodes 172 and the antenna 178 are formed by the printed circuit forming process.

For instance, a photoresist solution is applied to the copper foil attached to the sheet 170, the circuit pattern 188 and the pattern including the electrodes 172, the antenna 178, etc. are exposed to cure them, unnecessary photoresist is removed, then an unnecessary copper foil portion is removed by etching to obtain the desired pattern. As it will be discussed later, the computer 176 operates on the power supply provided by the electromagnetic induction electromotive force generated at the antenna 178 when the antenna 178 passes through the magnetic field.

The laminated member 130A is used in combination with a reader 190 shown in FIG. 26 that is provided in the card carrying path. The reader 190 has an external antenna 192, a transmitter 194, a receiver 196, a demodulator 198, and a microprocessor 200. In FIG. 26, reference numeral 202 denotes an external host computer, and 204 denotes a power supply. When the control signal issued from the external host computer 202 reaches the microprocessor 200 of the reader 190, the transmitter 194 emits an inquiry radio wave through the external antenna 192; the inquiry radio wave serves also as a feed radio wave.

When the laminated member 130A is sent into the carrying path and the antenna 178 receives the inquiry radio wave, the receiver 180 of the single-chip computer 176 sends the electromagnetic induction electromotive force providing the power supply to the controller 182 to charge the capacitor (not shown) built in the controller 182. The electric charges accumulated in the capacitor provide the power supply. The receiver 180 also sends the control signal received through the antenna 178 to the controller 182. The controller 182 receives the control signal and temporarily stores the pressure distribution data detected by the pressure measuring board 132A in the memory.

For instance, the control signal is read into the receiver 180 immediately before the laminated member 130A enters the gap and the controller 182 begins scanning of the electrodes 172A and 172B in accordance with the read control signal. Then, the electrical resistances of all the intersections of the electrodes 172A and 172B are determined in sequence. This operation is repeated at much higher speed than the feeding speed of the laminated member 130A while the laminated member 130A is passing through the gap. The electrical resistances indicate the pressures applied to the intersections. The modulator 184 modulates the data indicative of the pressures and sends it to the transmitter 186. The transmitter 186 sends out the data by radio waves through the antenna 178.

The external antenna 192 of the reader 190 receives the radio wave and sends it to a receiver 196. The received radio wave is demodulated by the demodulator 198 and sent to the microprocessor 200 and further to the external host computer 202. The external host computer 202 uses the data indicative of the pressures to determine the pressure distribution applied to the board 132A when the laminated member 130A passes through the gap. Thus, the dimension of the gap between the carrying roller 26 and the magnetic head 28 can be obtained.

FIGS. 27A, 27B, and 27C show the output examples of the pressure distribution detected by the laminated member 130A. In these figures, reference numeral 28 denotes the magnetic head; the laminated member 130 moves the magnetic head 28 from right to left. Hatched areas Q indicate the areas wherein the pressure level detected by the laminated member 130A exceeds a predetermined threshold value and the magnetic head 28 comes in contact with the step 140A of the elastic mat 134A shown in FIG. 22.

FIG. 27A illustrates a case where area $Q_A$ in which the magnetic head 28 comes in contact is formed linearly. This indicates that the laminated member 130A has been fed in the proper condition, namely, it has been fed linearly in the direction parallel to the long sides thereof. FIG. 27B illustrates a case where area $Q_B$ in which the magnetic head 28 comes in contact is formed obliquely in relation to the laminated member 130A. This indicates that the laminated member 130A is crookedly or obliquely fed through the carrying path.

FIG. 27C illustrates a case where area $Q_c$ is formed, meandering in relation to the laminated member 130A. This indicates that the laminated member 130A is fed while meandering widthwise in the carrying path. Thus, whether the card is being fed properly in the carrying path can be determined by checking the shape of area Q described above.

In the twelfth embodiment, two sheets, wherein each of them has many parallel thin-wire electrodes formed on one surface thereof and covered with a thin film of the pressure-sensitive resistive ink, are placed together face to face so that the electrodes of the two sheets are substantially orthogonalized so as to form the pressure sensors at the intersections of the electrodes. In this case, since the pressure sensors are distributed in the matrix or two-dimensional pattern, it is possible to detect the two-dimensional distribution of the pressures, permitting even higher accuracy of the detection of the pressure distribution in the width direction or dynamic carrying conditions of the laminated member or card. In this case also, the elastic mat should be provided with many projecting rows arranged in the card carrying direction or a wide stepped section in the width direction of the card.

In the twelfth embodiment, the data transfer between the pressure measuring board of the laminated member and the external host computer is implemented in the contactless fashion or by wireless. The pressure measuring board is provided with the single-chip computer and the antenna to transfer signals and data to and from the reader provided on the carrying path. The electromagnetic induction electromotive force generated at the antenna when the antenna provided on the laminated member passes through the magnetic field formed in the carrying path may be used as the power supply of the pressure measuring board of the laminated member. In this case, the capacitor for accumulating the electromotive force is provided in the laminated member.

Thirteenth Embodiment

Figure 28:
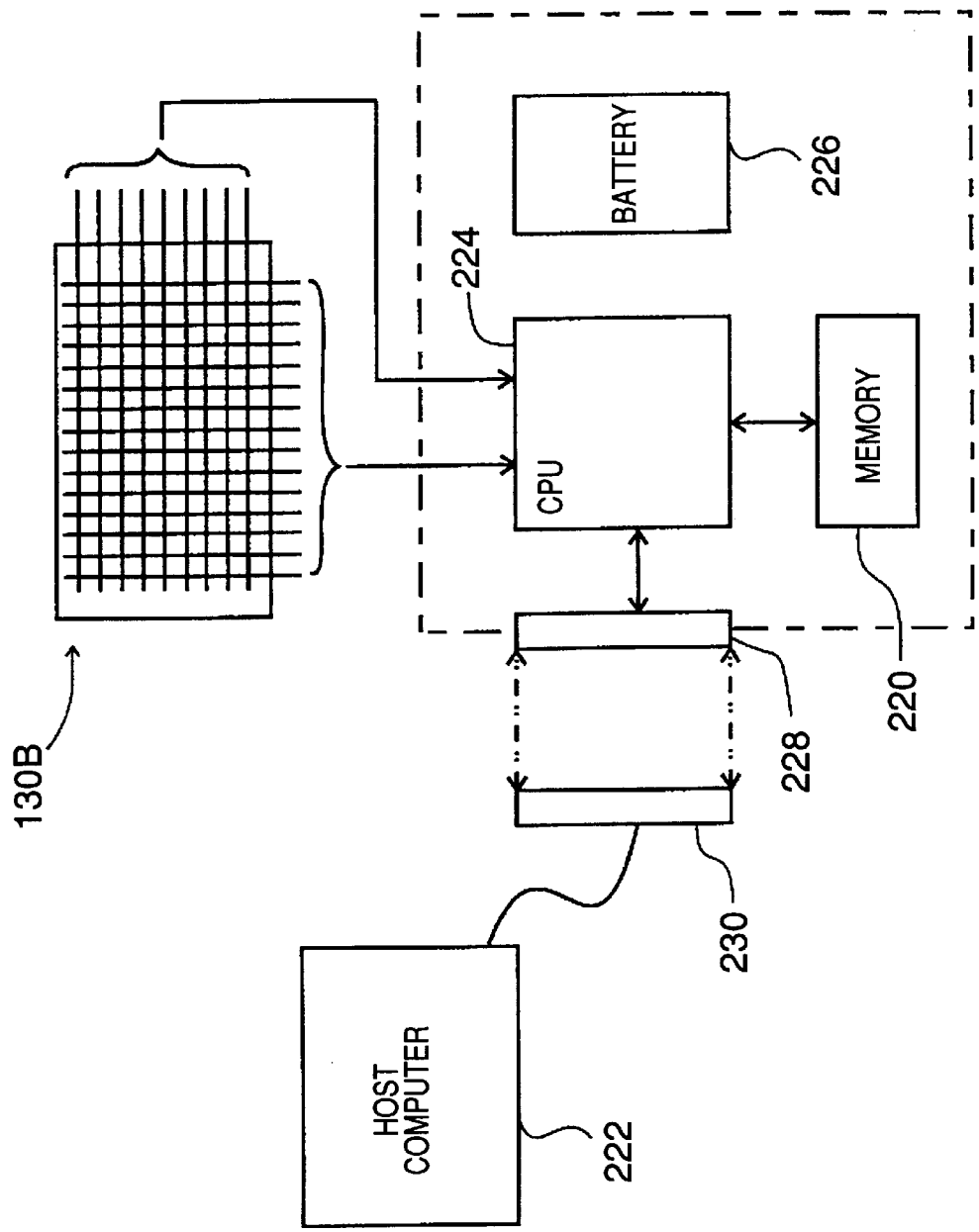
FIG. 28 is a block diagram showing the entire constitution of a gap dimension measuring system in accordance with a thirteenth embodiment.

FIG. 28 is a block diagram showing the entire constitution of the thirteenth embodiment of the gap dimension measuring system. This embodiment is different from the twelfth embodiment shown in FIGS. 22 through 26, which transfers the data of the laminated member 130B is transferred to the reader 190 by wireless via radio waves, in that it temporarily stores the data in a semiconductor memory 220 in the laminated member 130B, then after the laminated member is passed through the gap, the wiring cable is connected to transfer the data from the memory 220 to a host computer 222 to determine the pressure distribution.

More specifically, the pressure measuring board of the laminated member 130B has nearly the same electrode construction as that shown in FIGS. 24 and 25; it has a computer (CPU) 224, the semiconductor memory 220, a battery 226, and an external connection terminal 228. The terminal 228 can be connected to the host computer 222 by a connecting terminal 230 that is the counterpart thereof.

What is claimed is:

1. A method for measuring a dimension of a gap for passing a card therethrough, comprising the steps of:
   (a) providing a laminated member comprising a pressure measuring board and an elastic mat, the pressure measuring board having plural pressure sensors arranged substantially in a direction in which the card is inserted into the gap to electrically detect a pressure applied in the direction of a thickness of the respective pressure sensors, the elastic mat being superposed to cover at least said pressure sensors, a thickness of the elastic mat increasing from a front end of the mat to a rear end of the mat along the direction in which the card is inserted into the gap;
   (b) passing said laminated member through said gap;
   (c) storing the pressures detected by said plural pressure sensors; and
   (d) after the passage of said card through said gap, reading the stored pressures from the laminated member to determine the dimension of said gap.

2. The method according to claim 1, said pressure measuring board further comprising a memory for storing the pressures detected by said respective pressure sensors;
   wherein data of the pressures stored in said memory is read into an external host computer via a wiring cable connected to said laminated member after the passage of said card through said gap; and a pressure distribution is determined by said external host computer.

3. The method according to claim 1, wherein said pressure measuring board modulates the data of the pressures detected by said respective pressure sensors to transmit it through an antenna, and the data of said pressures is read in a contactless manner by a reader provided in a card carrying path so as to determine pressure distribution by said external host computer.

4. A laminated member for measuring the dimension of a gap for passing a card therethrough, comprising:
   an elastic mat having a stepped portion which gradually grows higher in steps from the front end thereof to the rear end thereof; and
   a pressure measuring board placed on said elastic mat and having plural pressure sensors arranged along said stepped portion.

5. The laminated member according to claim 4, wherein said respective pressure sensors are formed using load cells that employ strain gauges.

6. The laminated member according to claim 4, wherein said respective pressure sensors are formed using carrier diffusion type semiconductor pressure sensors.

7. The laminated member according to claim 4, wherein said pressure measuring board is formed by placing two sheets together face to face, in which plural parallel thin-wire electrodes formed on one surface of each are covered with a thin film of pressure-sensitive resistive ink, in such a manner that said electrodes are opposed to each other so that they intersect at substantially right angles, and intersections of said both electrodes arranged in a matrix pattern form said pressure sensors.

8. The laminated member according to claim 4, wherein said pressure measuring board has a microcomputer for processing outputs of said respective pressure sensors, a semiconductor memory for storing a result of said processing, and an external connection terminal for outputting contents of said semiconductor memory to an external computer.

9. The laminated member according to claim 8, wherein said pressure measuring board has a battery.

10. The laminated member according to claim 8, wherein said pressure measuring board uses, as a power supply thereof, an electromotive force based on electromagnetic induction generated when said laminated member passes through a magnetic field formed in a card carrying path.

11. The laminated member according to claim 4, wherein said pressure measuring board has: a single-chip computer incorporating a processor for processing the outputs of said respective pressure'sensors, a modulator for modulating the result of said processing, a transmitter, and a receiver; and an antenna connected to said transmitter and receiver.

12. The laminated member according to claim 11, wherein said pressure measuring board has a battery.

13. The laminated member according to claim 11, wherein said pressure measuring board uses, as a power supply thereof, an electromotive force based on electromagnetic induction generated when said laminated member passes through a magnetic field formed in a card carrying path.

14. A system for measuring a dimension of a gap for passing a card therethrough, comprising:

a laminated member which is passed through a path for said card, comprising an elastic mat having a stepped portion that gradually grows higher in steps from the front edge toward the rear edge thereof, a pressure measuring board that is placed on said elastic mat and has plural pressure sensors arranged along said steps, a single-chip computer incorporating a processor for processing outputs of said pressure sensors, a modulator, a transmitter, a receiver, and an antenna;

a reader provided in a carrying path of said card to transmit and receive data and information to and from said laminated member by wireless, said reader comprising an external antenna, a transmitter, a receiver, a demodulator, and a microcomputer which processes the output of said demodulator and transmits and receives information to and from an external host computer; and the external host computer which is connected to said reader and that determines distribution of received pressures according to received data to determine the dimension of said gap.

15. The system according to claim 14, wherein said single-chip computer uses, as a power supply thereof, a magnetic induction electromotive force generated when said laminated member passes through a magnetic field formed in the carrying path of said card.

* * * * *